United States Patent
Qiu et al.

(10) Patent No.: US 12,310,214 B2
(45) Date of Patent: *May 20, 2025

(54) PIXEL ARRANGEMENT STRUCTURE, ORGANIC ELECTROLUMINESCENT DISPLAY PANEL, METAL MASK AND DISPLAY DEVICE

(71) Applicants: CHENGDU BOE OPTOELECTRONICS TECHNOLOGY CO., LTD., Chengdu (CN); BOE TECHNOLOGY GROUP CO., LTD., Beijing (CN)

(72) Inventors: Haijun Qiu, Beijing (CN); Yangpeng Wang, Beijing (CN); Benlian Wang, Beijing (CN); Haijun Yin, Beijing (CN); Yang Wang, Beijing (CN); Yao Hu, Beijing (CN); Weinan Dai, Beijing (CN)

(73) Assignees: Chengdu BOE Optoelectronics Technology Co., Ltd., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

This patent is subject to a terminal disclaimer.

(21) Appl. No.: 18/619,133

(22) Filed: Mar. 27, 2024

(65) Prior Publication Data

US 2024/0244914 A1    Jul. 18, 2024

Related U.S. Application Data

(63) Continuation of application No. 18/204,372, filed on May 31, 2023, now Pat. No. 11,974,484, which is a
(Continued)

(30) Foreign Application Priority Data

Jan. 2, 2018    (CN) .......................... 201810002736.0

(51) Int. Cl.
H10K 59/35    (2023.01)
H10K 71/00    (2023.01)
H10K 71/16    (2023.01)

(52) U.S. Cl.
CPC ......... H10K 59/353 (2023.02); H10K 59/352 (2023.02); H10K 71/00 (2023.02); H10K 71/164 (2023.02); H10K 71/166 (2023.02)

(58) Field of Classification Search
CPC .... H10K 59/352; H10K 59/353; H10K 71/00; H10K 71/164; H10K 71/166; G09G 3/32;
(Continued)

(56) References Cited

U.S. PATENT DOCUMENTS 9,589,492 B2    3/2017    Feng
9,704,926 B2    7/2017    Kim
(Continued)

FOREIGN PATENT DOCUMENTS

CN    103311266 A    9/2013
CN    103366683 A    10/2013
(Continued)

OTHER PUBLICATIONS

First Office Action from Chinese Application No. 20180002736.0, Dated Mar. 11, 2024, 12 pages.
(Continued)

*Primary Examiner* — Brook Kebede
(74) *Attorney, Agent, or Firm* — Kinney & Lange, P.A.

(57) ABSTRACT

A pixel arrangement structure includes: first sub-pixels, second sub-pixels and third sub-pixels, being not overlapped but being spaced apart. The third sub-pixel includes a first edge facing the first sub-pixel, the first sub-pixel includes a second edge facing the third sub-pixel, the third sub-pixel includes a third edge facing the second sub-pixel, and the second sub-pixel includes a fourth edge facing the third
(Continued)

sub-pixel, and shapes of the first sub-pixel and the second sub-pixel are circles, the first edge and the second edge are curved edges with a same curvature, the third edge and the fourth edge are curved edges with a same curvature; or shapes of the first sub-pixel and the second sub-pixel are octagons, at least part of the first edge is parallel to at least part of the second edge, at least part of the third edge is parallel to at least part of the fourth edge.

17 Claims, 9 Drawing Sheets

Related U.S. Application Data continuation of application No. 17/650,374, filed on Feb. 8, 2022, now Pat. No. 11,706,965, which is a continuation of application No. 16/469,110, filed as application No. PCT/CN2018/115450 on Nov. 14, 2018, now Pat. No. 11,271,048.

(58) Field of Classification Search
CPC .. G09G 3/3208; G09G 3/3216; G09G 3/3225; G09G 3/3611
See application file for complete search history.

(56) References Cited

U.S. PATENT DOCUMENTS

| | | | |
|---|---|---|---|
| 9,818,803 B2 | 11/2017 | Lee | |
| 9,959,808 B2 | 5/2018 | Sun | |
| 10,325,959 B2 | 6/2019 | Wang et al. | |
| 10,446,618 B2 | 10/2019 | Wang et al. | |
| 11,271,048 B2* | 3/2022 | Qiu | H10K 71/00 |
| 11,706,965 B2* | 7/2023 | Qiu | H10K 59/352 |
| | | | 257/40 |
| 11,974,484 B2* | 4/2024 | Qiu | H10K 59/353 |
| 2003/0103058 A1* | 6/2003 | Hellen Brown Elliott | |
| | | | G09G 3/2003 |
| | | | 345/589 |
| 2013/0234917 A1 | 9/2013 | Lee | |
| 2015/0015466 A1 | 1/2015 | Feng | |
| 2015/0162391 A1 | 6/2015 | Kim | |
| 2016/0071910 A1 | 3/2016 | Sasaki et al. | |
| 2016/0351116 A1* | 12/2016 | Sun | G02F 1/134309 |
| 2017/0011685 A1 | 1/2017 | Jeon | |
| 2018/0069057 A1 | 3/2018 | Lee | |
| 2018/0247984 A1 | 8/2018 | Wang et al. | |
| 2019/0333970 A1 | 10/2019 | Lee | |
| 2023/0209947 A1 | 6/2023 | Lee | |

FOREIGN PATENT DOCUMENTS

| | | |
|---|---|---|
| CN | 104282727 A | 1/2015 |
| CN | 104466007 A | 3/2015 |
| CN | 204257654 U | 4/2015 |
| CN | 104701341 A | 6/2015 |
| CN | 105206647 A | 12/2015 |
| CN | 106486513 A | 3/2017 |
| CN | 106486514 A | 3/2017 |
| CN | 106816449 A | 6/2017 |
| CN | 108364983 A | 8/2018 |
| CN | 207966982 U | 10/2018 |
| CN | 207966983 U | 10/2018 |
| CN | 207966984 U | 10/2018 |
| CN | 207966985 U | 10/2018 |
| CN | 207966986 U | 10/2018 |
| CN | 207966987 U | 10/2018 |
| CN | 207966988 U | 10/2018 |
| WO | 2017045534 A1 | 3/2017 |

OTHER PUBLICATIONS

International Search Report and Written Opinion dated Feb. 14, 2019, for corresponding PCT Application No. PCT/CN2018/115450.
Notice of Allowance dated Jan. 25, 2024, for corresponding U.S. Appl. No. 18/204,372.
Notice of Allowance dated Mar. 6, 2023, for corresponding U.S. Appl. No. 17/650,374.
Notice of Allowance dated Nov. 1, 2021, for corresponding U.S. Appl. No. 16/469,110.
Third Chinese Office Action dated Mar. 26, 2025, for corresponding Chinese Patent Application No. 201810002736.0, 10 pgs.

* cited by examiner

PIXEL ARRANGEMENT STRUCTURE, ORGANIC ELECTROLUMINESCENT DISPLAY PANEL, METAL MASK AND DISPLAY DEVICE

CROSS-REFERENCE TO RELATED APPLICATION(S)

This application is a Continuation Application of U.S. application Ser. No. 18/204,372, filed on May 31, 2023, which is a Continuation Application of U.S. application Ser. No. 17/650,374, filed on Feb. 8, 2022, which is a Continuation Application of U.S. application Ser. No. 16/469,110, filed on Jun. 12, 2019, entitled "PIXEL ARRANGEMENT STRUCTURE, ORGANIC ELECTROLUMINESCENT DISPLAY PANEL, METAL MASK AND DISPLAY DEVICE", which is a Section 371 National Stage Application of International Application No. PCT/CN2018/115450, filed on Nov. 14, 2018, entitled "PIXEL ARRANGEMENT STRUCTURE, ORGANIC ELECTROLUMINESCENT DISPLAY PANEL, METAL MASK AND DISPLAY DEVICE", which claims priority to Chinese Patent Application Invention No. 201810002736.0 filed on Jan. 2, 2018 in the China National Intellectual Property Administration, the whole disclosures of which are incorporated herein by reference.

BACKGROUND

Field

Embodiments of the present disclosure generally relate to the technical field of display technology, and in particular, to a pixel arrangement structure, an organic electroluminescent display panel, a metal mask and a display device.

Description of the Related Art

Organic Light Emitting Diode (OLED) display devices, or organic electroluminescent display devices, have become one of the hot research spots in a research field of flat panel display at present; and as compared with liquid crystal displays, OLED display devices have advantages such as relatively low power consumption, relatively low production cost, self-luminescence, relatively wide viewing angle and relatively fast response speed and the like. At present, in the field of flat panel display comprising mobilephone, PDA, digital camera and the like, OLED display devices have gradually replaced conventional liquid crystal displays (LCDs).

An OLED display device has its structure mainly comprising: a base substrate; and pixels manufactured on the base substrate and arranged in a matrix. Various pixels are generally prepared from an organic material, by forming organic electroluminescent structures at positions of respective pixels on an array substrate due to an evaporation film-forming technology applied through a highly fine metal mask.

In relevant OLED display devices, the larger a distance among pixels in a pixel arrangement structure is, then, in a condition of a same resolution, the smaller an opening area of each pixel is, and a drive current is required to be increased accordingly so as to meet requirements of luminance during display.

SUMMARY

The embodiments of the present disclosure have been made to overcome or alleviate at least one aspect of the above mentioned disadvantages and/or shortcomings in the prior art, by providing a pixel arrangement structure, an organic electroluminescent display panel, a metal mask and a display device in embodiments of the disclosure.

Following technical solutions are adopted in exemplary embodiments of the disclosure.

According to one aspect of embodiments of the disclosure, there is provided a pixel arrangement structure, comprising: a plurality of sub-pixels arranged such that they are not overlapped with but are spaced apart from one another, comprising: a plurality of first sub-pixels, a plurality of second sub-pixels and a plurality of third sub-pixels;

wherein the plurality of first sub-pixels are arranged to define a first virtual rectangle, by locating one of the plurality of first sub-pixels at a position functioning as a position of a central point of the first virtual rectangle and locating other four first sub-pixels of the plurality of first sub-pixels at respective positions functioning as positions of four vertices of the first virtual rectangle respectively, and the first virtual rectangle comprises four second virtual rectangles which are arranged in a 2×2 matrix in mirror symmetry and abut against one another one by one, and each two second virtual rectangles abutting against each other share two common vertices located at interface where said each two second virtual rectangles abut against each other and a common side edge defined between the two common vertices; the plurality of second sub-pixels are located respectively at positions of central points of side edges of the first virtual rectangle, and two of the plurality of second sub-pixels located at respective central positions of two adjacent side edges of the first virtual rectangle, and one of the plurality of first sub-pixels located adjacent to the two second sub-pixels at a position of a vertex of the first virtual rectangle where the two adjacent side edges intersect with each other, and another one of the plurality of first sub-pixels located adjacent to the two second sub-pixels at a position of the central point of the first virtual rectangle are located respectively to define cooperatively respective positions of four vertices of each of the four second virtual rectangles; and the plurality of third sub-pixels are located within the four second virtual rectangles respectively; and each of the plurality of third sub-pixels is shaped to be one type of following: a concave polygon which comprises a plurality of side edges in the form of straight line segments or fold line segments, and in response to any of the side edges thereof extending infinitely at both ends thereof to be a straight line, other side edges failing to be located on a same side of the straight line; or a closed pattern formed by a plurality of continuous line segments comprising curved line segments.

According to embodiments of the disclosure, at least one of the plurality of third sub-pixels is shaped to be in the form of concave quadrilateral having at least one side edge in the form of concave curved line segment or concave fold line segment According to embodiments of the disclosure, at least one of the plurality of third sub-pixels is shaped in the form of: a quadrilateral having four side edges thereof being concave, or a quadrilateral having two opposed side edges thereof being concave and other two side edges thereof being convex.

According to embodiments of the disclosure, in each third sub-pixel which is shaped in the form of the quadrilateral having four sides thereof being concave, at least one concave side edge is a curved line segment or a fold line segment.

According to embodiments of the disclosure, in each third sub-pixel which is shaped in the form of the quadrilateral having two opposed side edges thereof being concave and other two side edges thereof being convex, at least one concave side edge is a concave curved line segment or a concave fold line segment, and at least one convex side edge is a convex curved line segment or a convex fold line segment.

According to embodiments of the disclosure, at least one of the plurality of third sub-pixels is shaped in the form of a closed pattern formed by a plurality of continuous line segments comprising curved line segments, the curved line segments being shaped in the form of following: concave curved line segments, convex curved line segments, or zigzag undulate curved line segments.

According to embodiments of the disclosure, the closed pattern comprises one of following patterns comprising: a circular pattern, an elliptic pattern, a quasi-circular pattern, or a quasi-elliptic pattern.

According to embodiments of the disclosure, a ratio between a maximum value and a minimum value of a distance between respective side edges facing toward each other of each third sub-pixel and a respective adjacent one of the plurality of first sub-pixels adjacent to said each third sub-pixel ranges between 0.8 and 1.2.

According to embodiments of the disclosure, a ratio between a maximum value and a minimum value of a distance between respective side edges facing toward each other of each third sub-pixel and the respective adjacent one of the plurality of first sub-pixels adjacent to said each third sub-pixel ranges between 0.9 and 1.1.

According to embodiments of the disclosure, a ratio between a maximum value and a minimum value of a distance between respective side edges facing toward each other of each third sub-pixel and a respective adjacent one of the plurality of second sub-pixels adjacent to said each third sub-pixel ranges between 1 and 1.5.

According to embodiments of the disclosure, respective side edges facing toward each other of each third sub-pixel and the respective adjacent one of the plurality of first sub-pixels adjacent to said each third sub-pixel are shaped to be complementary patterns, and edges of respective portions facing towards each other of each third sub-pixel and the respective adjacent one of the plurality of first sub-pixels adjacent to said each third sub-pixel are in the form of curved line segments or fold line segments having respective shapes mating with each other.

According to embodiments of the disclosure, respective side edges facing toward each other of each third sub-pixel and the respective adjacent one of the plurality of first sub-pixels adjacent to said each third sub-pixel are in parallel with each other; and/or respective side edges facing toward each other of each third sub-pixel and the respective adjacent one of the plurality of second sub-pixels adjacent to said each third sub-pixel are in parallel with each other.

According to embodiments of the disclosure, each of the third sub-pixels is located at a position of an intersection point where a straight line connecting between two first sub-pixels adjacent to each other in a respective second virtual rectangle intersects with another straight line connecting between two second sub-pixels adjacent to each other in the respective second virtual rectangle.

According to embodiments of the disclosure, the plurality of third sub-pixels have the same shape as one another.

According to embodiments of the disclosure, each of two of the plurality of third sub-pixels located in a direction of one diagonal line of the first virtual rectangle has a first shape, and each of another two of the plurality of third sub-pixels located in a direction of the other diagonal line of the first virtual rectangle has a second shape different from the first shape.

According to embodiments of the disclosure, four of the plurality of third sub-pixels which are located respectively within the four second virtual rectangles cooperating with one another to form the first virtual rectangle, are arranged in a 'X' shaped distribution.

According to embodiments of the disclosure, two opposite side edges of each of the four of the plurality of third sub-pixels are concave in a direction parallel to one diagonal line of the first virtual rectangle, and other two opposite side edges of each of the four of the plurality of third sub-pixels are concave in another direction parallel to the other diagonal line of the first virtual rectangle, respectively.

According to embodiments of the disclosure, in at least two of the plurality of third sub-pixels which extend in a direction parallel to one of two diagonal lines of the first virtual rectangle and point towards the central point of the first virtual rectangle, respective side edges facing towards the central point of the first virtual rectangle and respective side edges facing away from the central point of the first virtual rectangle are all concave.

According to embodiments of the disclosure, the plurality of first sub-pixels are shaped in the form of following: at least two of the plurality of first sub-pixels have different shapes from one another; or the plurality of first sub-pixels have the same shape as one another.

According to embodiments of the disclosure, the plurality of second sub-pixels are shaped in the form of following: at least two of the plurality of second sub-pixels have different shapes from one another; or the plurality of second sub-pixels have the same shape as one another.

According to embodiments of the disclosure, areas of the plurality of first sub-pixels are set as following: at least two of the plurality of first sub-pixels have different areas from one another, or the plurality of first sub-pixels have the same area as one another; and areas of the plurality of second sub-pixels are set as following: at least two of the plurality of second sub-pixels have different areas from one another, or the plurality of second sub-pixels have the same area as one another.

According to embodiments of the disclosure, one type of both the plurality of first sub-pixels and the plurality of second sub-pixels are red sub-pixels, while the other type of both the plurality of first sub-pixels and the plurality of second sub-pixels are blue sub-pixels; and the plurality of third sub-pixels are green sub-pixels.

According to embodiments of the disclosure, an area of a single one of the green sub-pixels is smaller than an area of a single one of the red sub-pixels, and is also smaller than an area of a single one of the blue sub-pixels.

According to embodiments of the disclosure, an area of a single one of the blue sub-pixels is greater than an area of a single one of the red sub-pixels, and the area of a single one of the red sub-pixels is in turn greater than an area of a single one of the green sub-pixels.

According to embodiments of the disclosure, an area of a single one of the blue sub-pixels is greater than an area of a single one of the green sub-pixels, and the area of a single one of the green sub-pixels is in turn greater than or equal to an area of a single one of the red sub-pixels.

According to embodiments of the disclosure, a ratio among a total area of the plurality of first sub-pixels functioning as the red sub-pixels, a total area of the plurality of third sub-pixels functioning as the green sub-pixels, and a total area of the plurality of second sub-pixels functioning as the blue sub-pixels is 1:(1.1~1.5):(1.2~1.7).

According to embodiments of the disclosure, a ratio among a total area of the plurality of first sub-pixels functioning as the red sub-pixels, a total area of the plurality of third sub-pixels functioning as the green sub-pixels, and a total area of the plurality of second sub-pixels functioning as the blue sub-pixels is 1:(1.2~1.35):(1.4~1.55).

According to embodiments of the disclosure, a ratio among a total area of the plurality of first sub-pixels functioning as the red sub-pixels, a total area of the plurality of third sub-pixels functioning as the green sub-pixels, and a total area of the plurality of second sub-pixels functioning as the blue sub-pixels is 1:1.27:1.46.

According to another aspect of the exemplary embodiment of the present disclosure, there is provided an organic electroluminescent display panel, comprising a plurality of pixel arrangement structure closely/tightly arranged, each of which is the pixel arrangement structure as above, first virtual rectangles adjacent to each other in a row direction are arranged to share common sub-pixels located on respective side edges facing towards each other, and first virtual rectangles adjacent to each other in a column direction are arranged to share common sub-pixels located on respective side edges facing towards each other.

According to embodiments of the disclosure, a ratio among a total number of the plurality of first sub-pixels functioning as the red sub-pixels, a total number of the plurality of third sub-pixels functioning as the green sub-pixels, and a total number of the plurality of second sub-pixels functioning as the blue sub-pixels is 1:2:1.

According to another aspect of the exemplary embodiment of the present disclosure, there is provided a display device, comprising the organic electroluminescent display panel as above.

According to another aspect of the exemplary embodiment of the present disclosure, there is provided a metal mask configured to manufacture the pixel arrangement structure as above, comprising: a plurality of opening areas having the same shape as at least one type of the plurality of first sub-pixels, the plurality of second sub-pixels, or the plurality of third sub-pixels, and an orthogonal projection of the plurality of opening areas on a plane where the pixel arrangement structure is located at least partially overlaps with at least one type of the plurality of first sub-pixels, the plurality of second sub-pixels or the plurality of third sub-pixels in the pixel arrangement structure.

BRIEF DESCRIPTION OF THE DRAWINGS

The above and other features and advantages of the present disclosure will become more apparent and a more comprehensive understanding of the present disclosure can be obtained, by describing in detail exemplary embodiments thereof with reference to the accompanying drawings, in which.

DETAILED DESCRIPTION

Figure 1:
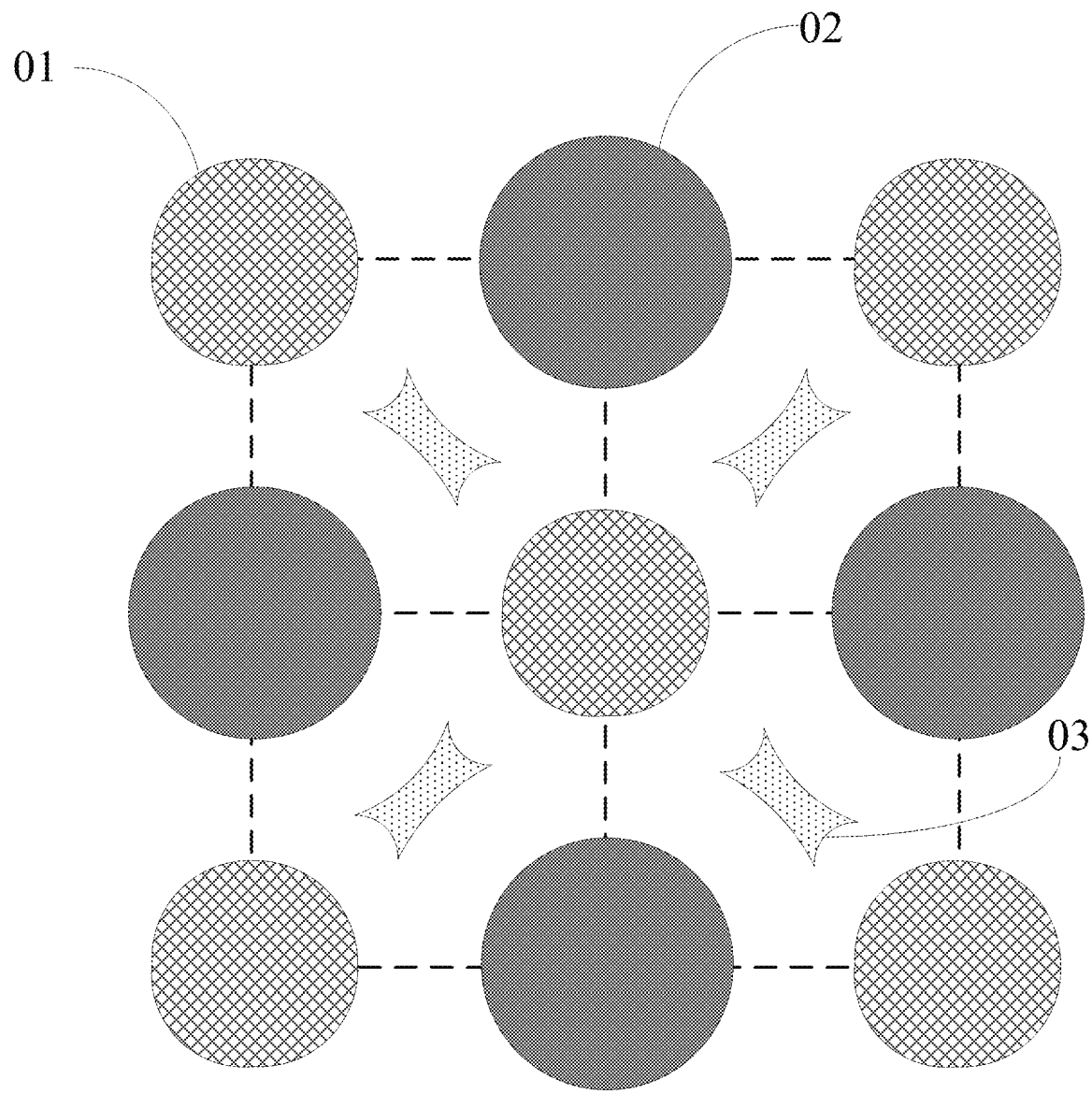
FIG. 1 illustrates a schematic view of a pixel arrangement structure according to exemplary embodiments of the disclosure.

Technical solutions of the disclosure will further be described in detail below in embodiments thereof, with reference to the accompanying drawings. In the specification and the drawings, the same or similar reference numerals are used to refer to the same or similar components or members. It is to be understood that the following description of the embodiments with reference to the accompanying drawings is intended to be illustrative of general inventive concept of the disclosure, rather than a limitation of the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Respective dimension and shape of each component in the drawings are only intended to exemplarily illustrate the contents of the disclosure, rather than to demonstrate the practical dimension or proportion of components of a pixel arrangement structure, an organic electroluminescent display panel, a metal mask and a display device.

According to a general inventive concept of embodiments of the disclosure, a pixel arrangement structure, an organic electroluminescent display panel, a metal mask and a display device are provided, intending to solve a problem existing in a relevant OLED device that distances among pixels thereof are relatively large.

In an aspect of embodiments of the disclosure, a pixel arrangement structure is provided; as illustrated in FIG. 1, it comprises: a plurality of sub-pixels located at positions illustrated in FIG. 1 and arranged such that they are not overlapped with but are spaced apart from one another, comprising a plurality of first sub-pixels 01, a plurality of second sub-pixels 02 and a plurality of third sub-pixels 03. Specifically, for example, one of the plurality of first sub-pixels 01 is arranged centrally within the plurality of first sub-pixels 01 while other four of the plurality of first sub-pixels 01 are arranged to surround the centrally arranged one of the plurality of first sub-pixels 01 so as to function as four vertices respectively to define a first virtual rectangle; in other words, the plurality of first sub-pixels are arranged to define the first virtual rectangle, i.e., by locating the plurality of first sub-pixels 01 respectively at positions of vertices of four corners and a central point of the first virtual rectangle; more specifically, by locating one of the plurality of first sub-pixels at a position being defined as a position of the central point of the first virtual rectangle and locating other four first sub-pixels of the plurality of first sub-pixels at respective positions being defined as positions of four vertices of the first virtual rectangle respectively. And the first virtual rectangle comprises four second virtual rectangles which are arranged in a 2×2 matrix in mirror symmetry and abutting against one another one by one, and each two second virtual rectangles abutting against each other share two common vertices located at interface where said each two second virtual rectangles abut against each other and a common side edge defined between the two common vertices.

The plurality of second sub-pixels 02 are located respectively at positions of central points of side edges of the first virtual rectangle; and two of the plurality of second sub-pixels 02 located at respective central positions of two adjacent side edges of the first virtual rectangle, and one of the plurality of first sub-pixels 01 located adjacent to the two second sub-pixels 02 at a position of a vertex of the first virtual rectangle where the two adjacent side edges intersect with each other, and another one of the plurality of first sub-pixels 01 located adjacent to the two second sub-pixels 02 at a position of the central point of the first virtual rectangle are located respectively to define cooperatively respective positions of four vertices of each of the four second virtual rectangles.

And the plurality of third sub-pixels 03 are located within the four second virtual rectangles respectively; and each of the plurality of third sub-pixels 03 is shaped to be one type of following: a concave polygon which comprises a plurality of side edges in the form of straight line segments or fold line segments, and in response to any of the side edges thereof extending infinitely at both ends thereof to be a straight line, other side edges failing to be located on a same side of the straight line; or a closed pattern formed by a plurality of continuous line segments comprising curved line segments.

Specifically, in comparison with relevant pixel arrangement structures, in above pixel arrangement structure according to embodiments of the disclosure, in a same process condition, by way of example, the plurality of first sub-pixels 01, the plurality of second sub-pixels 02 and the plurality of third sub-pixels 03 are arranged closely/tightly, so as to minimize spacings among adjacent pixels and among adjacent sub-pixels as much as possible. Moreover, the plurality of third sub-pixels 03 may be shaped to be in the form of a concave polygon (the expression "concave polygon" is defined as a polygon comprising a plurality of straight line side edges or fold line side edges, and in response to a condition that any of the side edges thereof extends infinitely at both ends thereof to be a straight line, other side edges being not located at a same side of the straight line), or a closed pattern formed by a plurality of continuous line segments (the plurality of continuous line segments may for example be, continuous curved line segments, or a plurality of continuous line segments comprising the curved line segments; therefore, said closed pattern may be formed by a plurality of smooth continuous line segments and thus may not be classified as a concave polygon or a convex polygon), thereby further decreasing a spacing between each of the plurality of third sub-pixels 03 and any of adjacent ones (i.e., adjacent to said each third sub-pixel 03) of the plurality of first sub-pixels 01, and decreasing a spacing between each of the plurality of third sub-pixels 03 and any of adjacent ones (i.e., adjacent to said each third sub-pixel 03) of the plurality of second sub-pixels 02. Therefore, in a condition of the same resolution, the opening area of each pixel is increased, such that a drive current of the display device is decreased and an aging speed of components in the display device is in turn inhibited or restrained, and a service life of the display components is in turn increased.

Figure 9A:
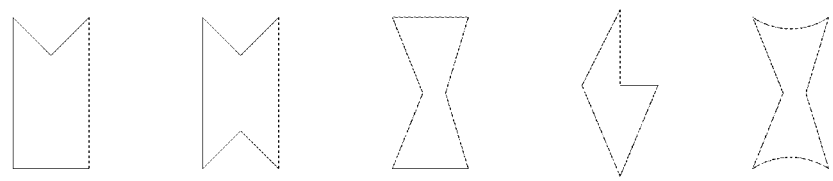
FIG. 9*a* and FIG. 9*b* illustrate schematic views of shapes of various of the plurality of third sub-pixels in the pixel arrangement structure according to an embodiment of the disclosure.

Specifically, in above pixel arrangement structure according to embodiments of the disclosure, the "concave polygon" shape of the plurality of third sub-pixels 03 refers to a polygon which is by no means a polygon in a conventional sense that can be referred to as "convex polygon" such as pentagon, hexagon, diamond shape, and the like (the "convex polygon" is defined as a polygon comprising a plurality of side edges, and in response to a condition that any of side edges thereof extends infinitely at both ends thereof to be a straight line, all other side edges being located at a same side of the straight line), and may essentially be a pattern in the form of any one of some irregular shapes, e.g., any one of various shapes as illustrated schematically in FIG. 9a, and these shapes as illustrated may for example be symmetric or asymmetric shapes, without being limited herein. Furthermore, a certain side edge of the concave polygon may for example in the form of a straight line segment, a curved line segment, or a fold line segment (the "fold line segment" herein means that it is formed by at least two straight line segments connected with each other at a non-zero angle therebetween). More specifically, the concave polygon in embodiments of the disclosure is for example defined as one of following patterns, i.e., a polygonal pattern, in a condition that the pattern comprises at least a certain side edge being in the form of a curved line segment or a fold line segment and other side edges being straight line segments, as to the pattern, provided that the side edge in the form of a curved line segment or a fold line segment extends indefinitely at both end points thereof, along tangent lines of the curved line segments thereat, or along the fold line segment itself, so as to form an extended line, then other side edges are not entirely located at a same side of the extended line; and moreover, provided that any one side edge in the form of a straight line segment extends indefinitely at both end points thereof along itself so as to form an extended line, then other side edges may not entirely located at a same side of this extended line.

Figure 9B:
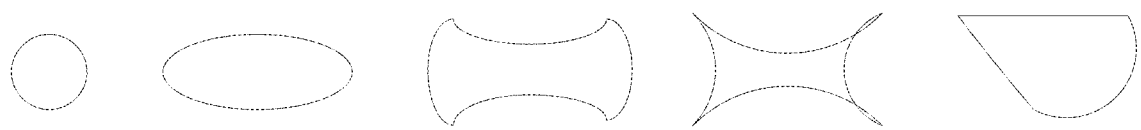

In additional or alternative embodiments of the disclosure, each of the plurality of third sub-pixels 03 is shaped in the form of a closed pattern formed by a plurality of continuous line segments comprising one type of following: concave curved line segments, convex curved line segments, or zigzag undulate curved line segments; as illustrated in FIG. 9b, the closed pattern may for example be a circular pattern, an elliptic pattern, a quasi-circular pattern, or a quasi-elliptic pattern, or other closed shape comprising curved line segments, etc., (for example a pattern which is formed to have a portion of side edges thereof being curved line segment(s) while other portion(s) of side edges thereof being straight line segment(s)), without being limited herein specifically.

It should be noticed that, in above pixel arrangement structure according to embodiments of the disclosure, by stating that each of the pixels (i.e., various sub-pixels) is located at a certain position, it means that the pixels (i.e., various sub-pixels) are located respectively within respective positional ranges as long as it can be ensured that the pixels are at least partially overlapped with respective positional ranges. In specific implementation, for example, centers of the pixels are overlapped with respective "positions"; certainly, centers of the pixels may alternatively not overlapped with respective "positions", e.g., there may be an offset therebetween, without being limited herein. In a specific implementation, for example, in the pixel arrangement structure, the pixel being located at a certain position means that an orthogonal projection of the pixel on a base substrate at least partially overlaps with an orthogonal projection region of the position on the base substrate.

Moreover, a center or a central point of each of the pixels (i.e., various sub-pixels) may for example be a geometric center of a pattern thereof, or for example be a center of a region of each of the pixels emitting color (light), without being limited herein.

By way of example, in above pixel arrangement structure, in order to ensure that various pixels may be distributed uniformly, their respective centers should be set to next to respective "positions of the pixels" as close as possible. For example, in embodiments, in the pixel arrangement structure, a certain pixel is provided at a certain position such that, an orthogonal projection of the pixel on the base substrate completely overlaps with an orthogonal projection region of said "certain position" on the base substrate.

It should be noticed that, in a display arrangement structure according to the embodiments of the disclosure, the first virtual rectangle is indicated by a maximal dotted box or dashed box as illustrated in FIG. 1, and the second virtual rectangles are minimum dotted box or dashed box as illustrated in FIG. 1. In FIG. 1, the first virtual rectangle comprises four second virtual rectangles, both the first virtual rectangle and the second virtual rectangles are for example in the form of oblong shapes or for example alternatively in the form of square shapes, without being limited herein specifically.

By way of example, in above pixel arrangement structure according to embodiments of the disclosure, as illustrated in FIGS. 1 to 6, the plurality of third sub-pixels 03 are shaped to be in the form of concave quadrilateral having at least one side edge in the form of concave curved line segment or concave fold line segment. Specifically, side edges of the concave quadrilateral being set as concave curved line segments or concave fold line segments may appropriately decrease opening areas of the plurality of third sub-pixels, and accordingly, more space may be left in each pixel arrangement structure for increasing opening areas of the plurality of first sub-pixels 01 and the plurality of second sub-pixels 02, so as to enhance service life of the product.

Figure 2:
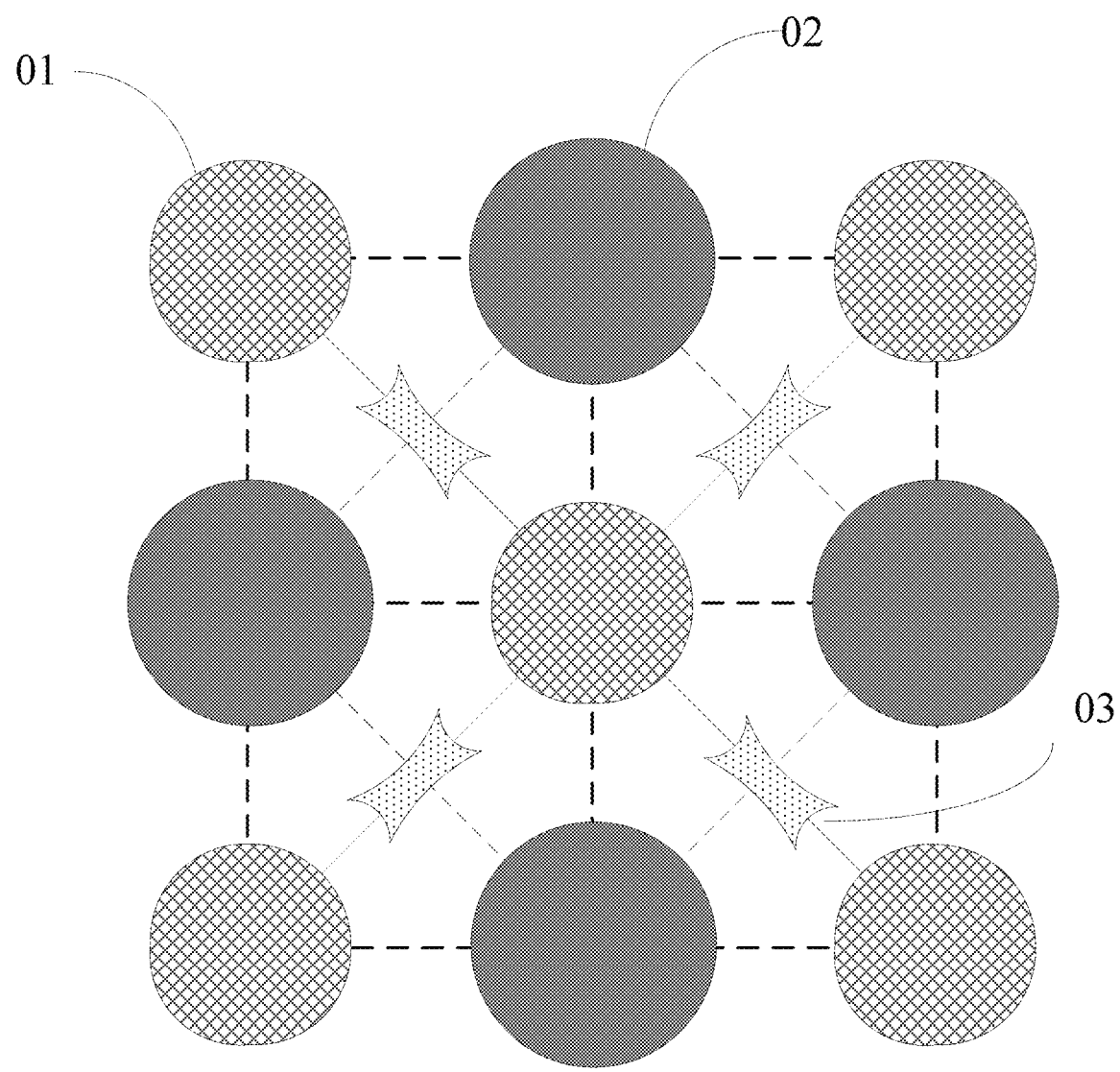
FIG. 2 illustrates a schematic view of another pixel arrangement structure according to exemplary embodiments of the disclosure.
Figure 3:
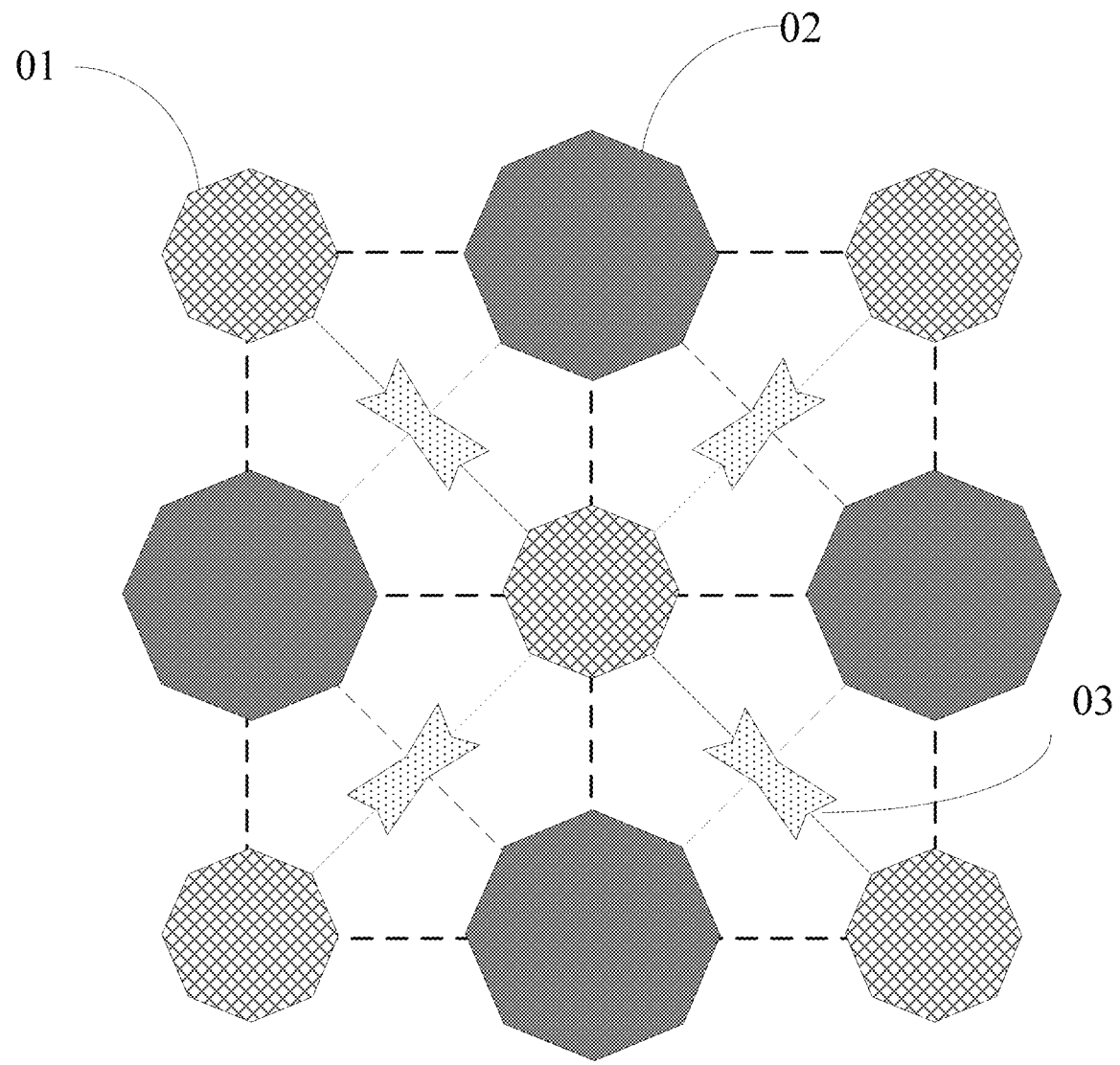
FIG. 3 illustrates a schematic view of still another pixel arrangement structure according to exemplary embodiments of the disclosure.
Figure 4:
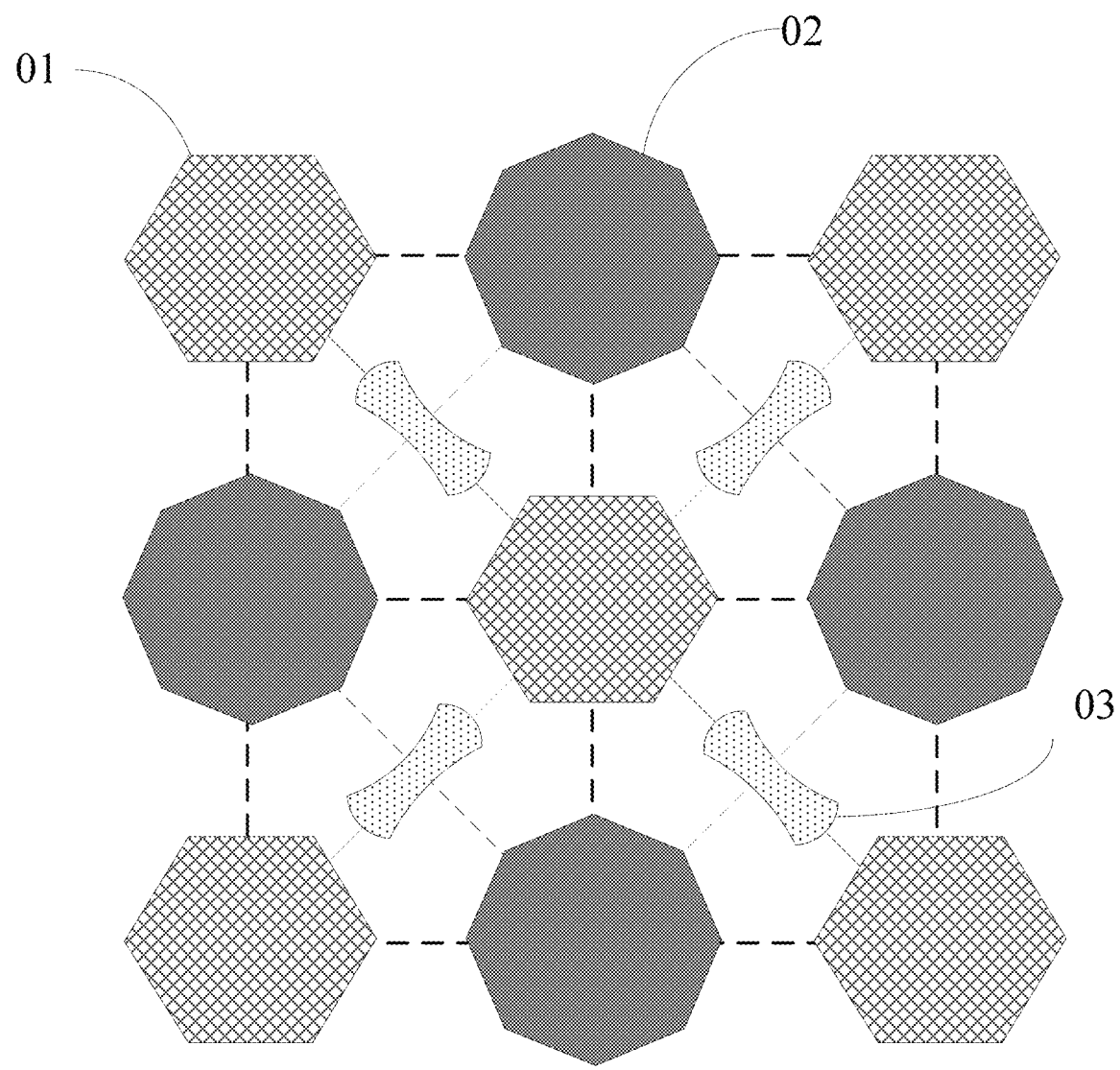
FIG. 4 illustrates a schematic view of yet another pixel arrangement structure according to exemplary embodiments of the disclosure.

For example, in above pixel arrangement structure according to embodiments of the disclosure, specific shapes of the plurality of third sub-pixels 03 may for example comprise at least one of following: quadrilaterals whose all of four side edges are concave, as illustrated in FIGS. 1, 2, 3, and 5; or quadrilaterals whose two opposed side edges are concave and other two side edges are convex, as illustrated in FIG. 4.

Figure 5:
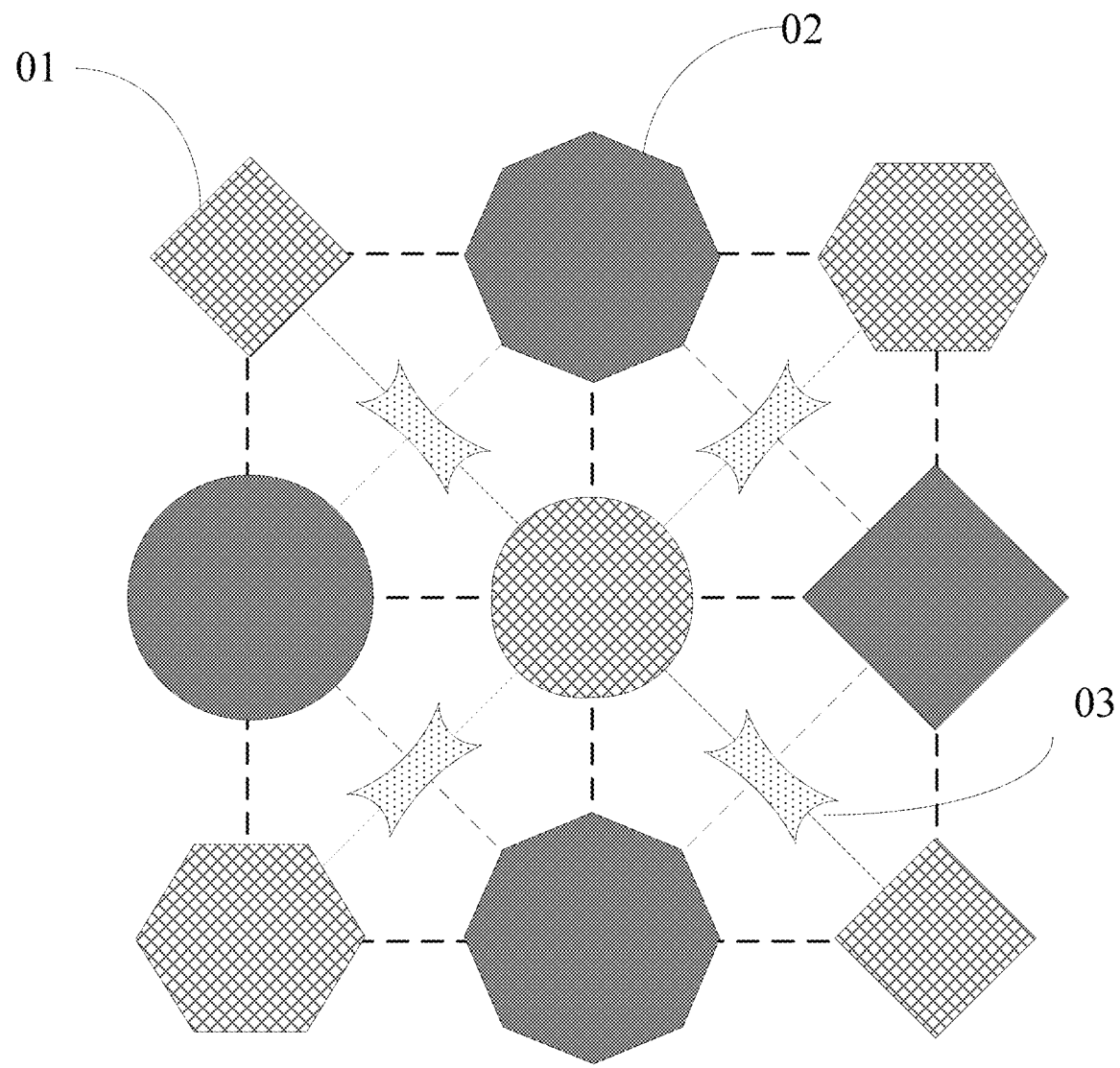
FIG. 5 illustrates a schematic view of further another pixel arrangement structure according to exemplary embodiments of the disclosure.

For example, in above pixel arrangement structure according to embodiments of the disclosure, as illustrated in FIGS. 1, 2, and 5, in each quadrilateral whose four side edges are concave, at least one concave side edge is for example a curved line segment; in specific embodiments, provided that each concave side edge in the form of curved line segment extends indefinitely at both end points thereof along tangent lines of the curved line segment thereat to form an extended line, then other side edges are not entirely located at a same side of the extended line. In alternative embodiments, as illustrated in FIG. 3, in each quadrilateral whose four side edges are concave, at least one concave side edge is for example a fold line segment; in specific embodiments, provided that each concave side edge in the form of fold line segment extends indefinitely at both end points thereof along itself, then other side edges are not entirely located at a same side of the extended line.

Specifically, four concave side edges of each of concave quadrilaterals of the plurality of third sub-pixels 03 as illustrated in FIGS. 1, 2 and 5 are curved line segments; and four concave side edges of each of concave quadrilaterals of the plurality of third sub-pixels 03 as illustrated in FIG. 3 are all fold line segments. In practical application, for example, there exists a condition in which a portion of side edges of each concave quadrilateral may be curved line segment(s) while the other portion of side edges of said each concave quadrilateral may be fold line segment(s).

By way of example, in above pixel arrangement structure according to embodiments of the disclosure, as illustrated in FIG. 4, in each quadrilateral whose two opposed side edges are concave and other two side edges are convex, then at least one concave side edge is for example a curved line segment or a fold line segment, and at least one convex side edge is for example a curved line segment or a fold line segment. And alternatively, for example, said "concave quadrilateral" shape of the plurality of third sub-pixels 03 may comprises conditions in which only one side edge or adjacent two side edges or three side edges may be concave but other side edge(s) may be convex, without being limited specifically herein. Specifically, for example, as illustrated in FIG. 4, both concave and convex side edges of the plurality of third sub-pixels 03 are curved line segments. In practical application, for example, there may exist a condition, in which one concave side edge is a curved line segment, one concave side edge is a fold line segment, one convex side edge is a curved line segment, and one convex side edge is a fold line segment, without being limited herein.

For example, in above pixel arrangement structure according to embodiments of the disclosure, in the concave quadrilaterals of the plurality of third sub-pixels 03, curvatures of curved line side edges or fold line side edges thereof, and specific forms of convex or concave presented by side edges, and bending degree/level of the side edges may for example be adjusted depending on specific shapes of the plurality of first sub-pixels 01 and the plurality of second sub-pixels 02.

By way of example, in above pixel arrangement structure according to embodiments of the disclosure, in a condition that at least one of the plurality of third sub-pixels is shaped to be a pattern comprising curved line segments, the pattern comprising curved line segments for example comprises following: a circular pattern, an elliptic pattern, a quasi-circular pattern, or a quasi-elliptic pattern, or other closed shape comprising curved line segments, etc, (for example a pattern which is formed to have a portion of side edges thereof being curved line segment(s) while other portion(s) of side edges thereof being straight line segment(s)), without being limited herein specifically.

Figure 10:
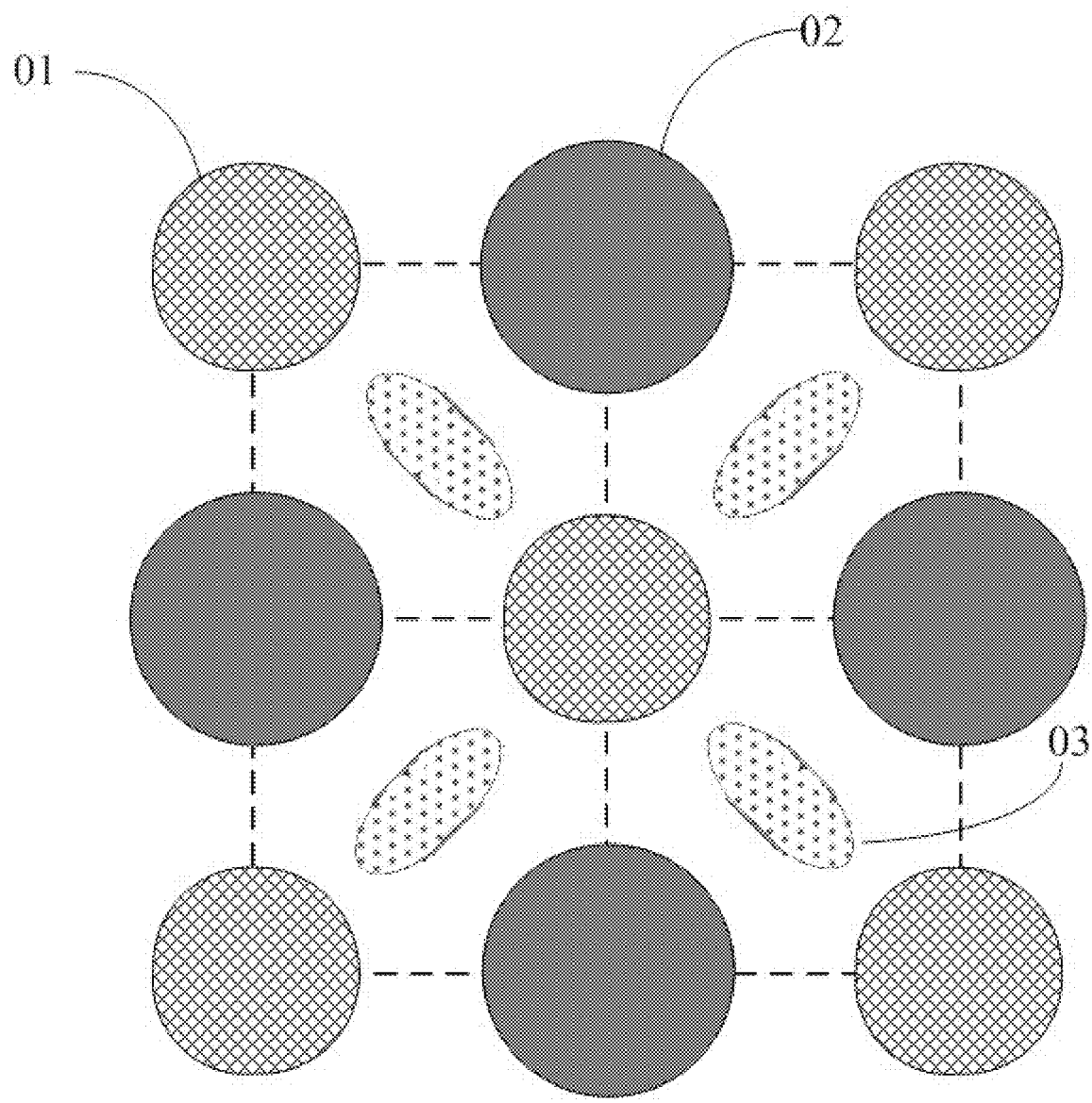
FIG. 10 illustrates a schematic view of another pixel arrangement structure according to exemplary embodiments of the disclosure, with the plurality of third sub-pixels for example being elliptical shapes.

For example, in above pixel arrangement structure according to embodiments of the disclosure, for example, at least one of the plurality of third sub-pixels may be elliptic. In exemplary embodiments, for example, as illustrated in FIG. 10, all of the plurality of third sub-pixels may for example be elliptic, and are arranged such that respective major axes of elliptic shapes thereof coincide with diagonal lines of respective second virtual rectangles (in which the plurality of third sub-pixels are located respectively) pointing towards the central point of the first virtual rectangle, and accordingly, i.e., respective minor axes of elliptic shapes thereof are perpendicular to diagonal lines of respective second virtual rectangles (in which the plurality of third sub-pixels are located respectively) pointing towards the central point of the first virtual rectangle.

For example, in above pixel arrangement structure according to embodiments of the disclosure, it is required that a minimum distance between respective side edges facing toward each other of each third sub-pixel 03 and a respective adjacent one (i.e., adjacent to said each third sub-pixel 03) of the plurality of first sub-pixels 01 is larger than or equal to a process limit distance, and a minimum distance between respective side edges facing toward each other of each third sub-pixel 03 and a respective adjacent one (i.e., adjacent to said each third sub-pixel 03) of the plurality of second sub-pixels 02 is also larger than or equal to the process limit distance, so as to meet specific requirements of process. In embodiments of the disclosure, a definition of a distance between two side edges refers to a set or aggregation of a series of distances between various points on a side edge and various points on another side edge, and said definition is used similarly hereinafter.

By way of example, in above pixel arrangement structure according to embodiments of the disclosure, a ratio between a maximum value and a minimum value of a distance between respective side edges facing toward each other of each third sub-pixel 03 and a respective adjacent one (i.e., adjacent to said each third sub-pixel) of the plurality of first sub-pixels 01 ranges between 1 and 1.5; specifically, the ratio between the maximum value and the minimum value of a distance between respective side edges facing toward each other of each third sub-pixel 03 and a respective adjacent one of the plurality of first sub-pixels 01 adjacent to said each third sub-pixel ranges between 0.8 and 1.2, more preferably between 0.9 and 1.1, for example, specific value of the ratio may be 1.1, 1.2, 1.3 or 1.4, or even 1 (i.e., the maximum value and the minimum value of a distance between respective side edges facing toward each other of each third sub-pixel 03 and a respective adjacent one of the plurality of first sub-pixels 01 adjacent to said each third sub-pixel 03 are equal; and therefore, it is in turn defined that, respective side edges facing toward each other of each third sub-pixel 03 and a respective adjacent one of the plurality of first sub-pixels 01 adjacent to said each third sub-pixel 03 are parallel to each other, and such a definition is also applicable to similar expression "parallel to" used hereinafter, i.e., a maximum value and a minimum value of a distance between two side edges facing towards each other are equal to each other). Similarly, a ratio between a maximum value and a minimum value of a distance between respective side edges facing toward each other of each third sub-pixel 03 and a respective adjacent one of the plurality of second sub-pixels 02 adjacent to said each third sub-pixel 03 ranges between 1 and 1.5; specifically, for example, specific value of the ratio may be 1:1, 1.2, 1.3 or 1.4. Furthermore, in a condition that the ratio between the maximum value and the minimum value of a distance between respective side edges facing toward each other of each third sub-pixel 03 and a respective adjacent one of the plurality of first sub-pixels 01 (or a respective adjacent one of the plurality of second sub-pixels 02) adjacent to said each third sub-pixel 03 is larger than 1, it indicates that shapes of side edges facing towards each other are not in consistent with each other.

By way of example, in above pixel arrangement structure according to embodiments of the disclosure, in order to ensure that widths of spacings between the plurality of third sub-pixels 03 and the adjacent ones of the plurality of first sub-pixels 01 adjacent to the third sub-pixels 03 are in consistent with one another, so as to decrease said spacings between the plurality of third sub-pixels 03 and the adjacent ones of the plurality of first sub-pixels 01 adjacent to the third sub-pixels 03, then, as illustrated in FIG. 1 and FIG. 2, in a condition that the ratio between the maximum value and the minimum value of a distance between respective side edges facing toward each other of each third sub-pixel 03 and a respective adjacent one of the plurality of first sub-pixels 01 adjacent to said each third sub-pixel 03 (or a respective adjacent one of the plurality of second sub-pixels 02 adjacent to said each third sub-pixel 03) is always 1, it indicates that shapes of the side edges facing towards each other mate perfectly with each other, and the spacings therebetween always remain the same, thereby, it can be defined that respective side edges facing toward each other of each third sub-pixel 03 and a respective adjacent one of the plurality of first sub-pixels 01 adjacent to said each third sub-pixel 03 are arranged parallel to each other, i.e., it is defined that respective side edges facing toward each other of each third sub-pixel 03 and a respective adjacent one of the plurality of first sub-pixels 01 adjacent to said each third sub-pixel 03 are for example spaced apart from each other equidistantly. Moreover, for example, specifically, by setting specific shapes of respective side edges facing toward each other of each third sub-pixel 03 and a respective adjacent one of the plurality of first sub-pixels 01 adjacent to said each third sub-pixel 03 to be complementary patterns, such that edges of respective portions facing towards each other of each third sub-pixel and the respective adjacent one of the plurality of first sub-pixels adjacent to said each third sub-pixel 03 are shaped respectively in the form of curved line segments or fold line segments having respective shapes mating with each other, then, it can be implemented that respective side edges facing toward each other of each third sub-pixel 03 and a respective adjacent one of the plurality of first sub-pixels 01 adjacent to said each third sub-pixel 03 are parallel to each other. Certainly, in specific implementation, respective side edges facing toward each other of each third sub-pixel 03 and a respective adjacent one of the plurality of first sub-pixels 01 adjacent to said each third sub-pixel 03 may also for example be not parallel to each other, without being limited herein.

By way of example, in above pixel arrangement structure according to embodiments of the disclosure, in order to ensure that widths of spacings between the plurality of third sub-pixels 03 and the adjacent ones of the plurality of second sub-pixels 02 adjacent to the third sub-pixels 03 are in consistent with one another, so as to decrease said spacings between the plurality of third sub-pixels 03 and the adjacent ones of the plurality of second sub-pixels 02 adjacent to the third sub-pixels 03, then, as illustrated in FIG. 1 and FIG. 2, respective side edges facing toward each other of each third sub-pixel 03 and a respective adjacent one of the plurality of second sub-pixels 02 adjacent to said each third sub-pixel 03 are arranged parallel to each other, as defined by above definition of "parallel to". Moreover, for example, specifically, by setting specific shapes of respective side edges facing toward each other of each third sub-pixel 03 and a respective adjacent one of the plurality of second sub-pixels 02 adjacent to said each third sub-pixel 03 to be complementary patterns, such that edges of respective portions facing towards each other of each third sub-pixel and the respective adjacent one of the plurality of second sub-pixels adjacent to said each third sub-pixel 03 are shaped respectively in the form of curved line segments or fold line segments having respective shapes perfectly mating with each other, then, it can be implemented that respective side edges facing toward each other of each third sub-pixel 03 and a respective adjacent one of the plurality of second sub-pixels 02 adjacent to said each third sub-pixel 03 are parallel to each other. Certainly, in specific implementation, respective side edges facing toward each other of each third sub-pixel 03 and a respective adjacent one of the plurality of second sub-pixels 02 adjacent to said each third sub-pixel 03 may also for example be not parallel to each other, without being limited herein.

For example, in the pixel arrangement structure according to embodiments of the disclosure, a minimum spacing between respective side edges facing toward each other of each third sub-pixel 03 and one adjacent first sub-pixel 01 adjacent to said each third sub-pixel 03, is for example equal to a minimum spacing between respective side edges facing toward each other of each third sub-pixel 03 and another one adjacent first sub-pixel 01 adjacent to said each third sub-pixel 03.

For example, in the pixel arrangement structure according to embodiments of the disclosure, a minimum spacing between any of the first sub-pixels and any of the second sub-pixels, both of which are adjacent to each other, may for example be the same.

Moreover, any "minimum spacing" is typically the process limit distance, and specific numerical range of the minimum spacing is typically related to specific manufacturing process which is utilized. In a condition that pixel patterns are being formed with a fine metal mask (FMM) which is cooperative with an etching process, the minimum spacing is about 16 μm; and in a condition that pixel patterns are being formed by a process such as laser, electroforming or the like, the minimum spacing may become even smaller.

For example, in above pixel arrangement structure according to embodiments of the disclosure, in order to ensure that the plurality of third sub-pixels 03 may be distributed uniformly in the pixel arrangement structure, so as to decrease a spacing between each of the plurality of third sub-pixels 03 and a respective adjacent one of the plurality of first sub-pixels 01 adjacent to said each third sub-pixel 03, and to decrease a spacing between each of the plurality of third sub-pixels 03 and a respective adjacent one of the plurality of second sub-pixels 02 adjacent to said each third sub-pixel 03, as illustrated in FIG. 2 to FIG. 6, then, each third sub-pixels 03 is located at a position of an intersection point where a straight line connecting between two first sub-pixels 01 adjacent to each other in a respective second virtual rectangle intersects with another straight line connecting between two second sub-pixels 02 adjacent to each other in the respective second virtual rectangle.

For example, specific shapes of the plurality of first sub-pixels 01, of the plurality of second sub-pixels 02, and of the plurality of third sub-pixels 03, and positional relationship, parallel or angular relationship among the plurality of first sub-pixels 01, the plurality of second sub-pixels 02, and the plurality of third sub-pixels 03, and the like may for example be designed depending on requirements; and in practical processes, there may be some deviations due to restrictions of process conditions or other factors. Therefore, it is only required that shapes, positions and relative positional relationships of various sub-pixels meet above requirements, then embodiments in which shapes, positions and relative positional relationships of various sub-pixels meet above requirements all belong to the pixel arrangement structure according to embodiments of the disclosure.

Figure 7:
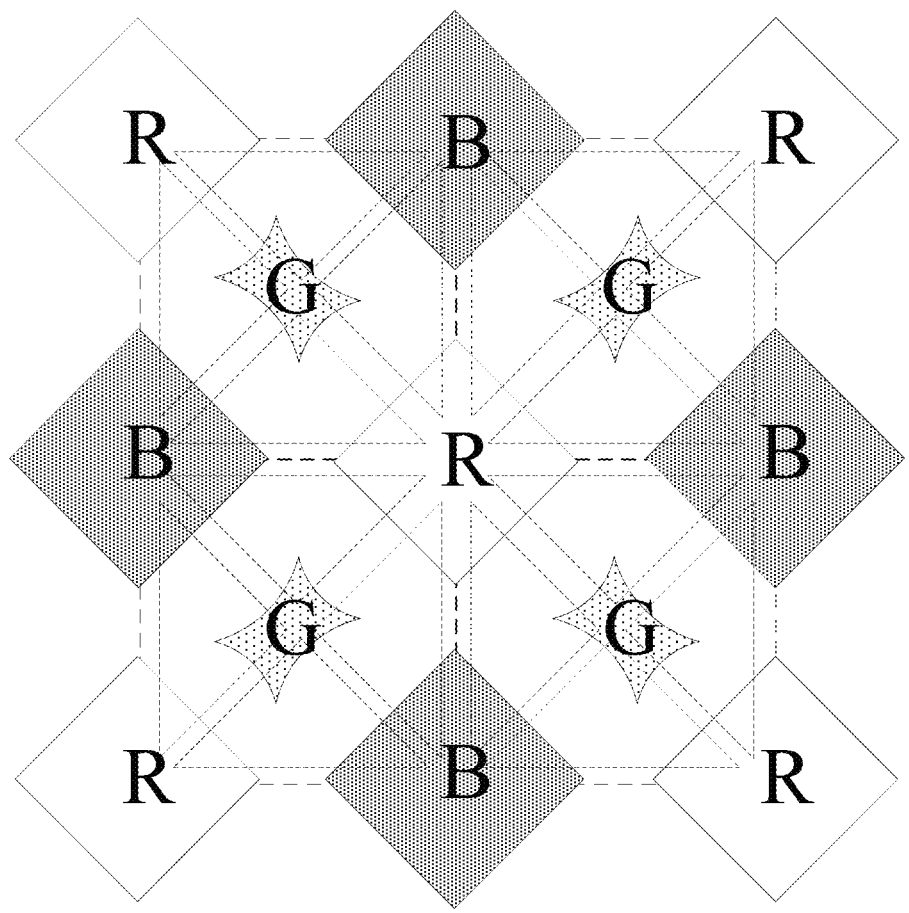
FIG. 7 illustrates a schematic view of still yet further another pixel arrangement structure according to exemplary embodiments of the disclosure.

By way of example, in the pixel arrangement structure according to embodiments of the disclosure, the plurality of first sub-pixels 01 are for example red sub-pixels, the plurality of second sub-pixels 02 are for example blue sub-pixels; or alternatively, the plurality of first sub-pixels 01 are for example blue sub-pixels, the plurality of second sub-pixels 02 are for example red sub-pixels; and the plurality of third sub-pixels 03 are for example green sub-pixels. Then, as illustrated in FIG. 7, one green sub-pixel G located at the center of one of the second virtual rectangles for example cooperates with red sub-pixels R and blue sub-pixels B located respectively at any two adjacent corners of the second virtual rectangle in which said green sub-pixel G is located so as to form collectively a light-emitting pixel point, i.e., each second virtual rectangle forms a respective one light-emitting pixel point.

Furthermore, an area of a single sub-pixel is discussed schematically and exemplarily hereinafter.

Since human eyes are relatively sensitive to green light, then, for example, in the pixel arrangement structure according to embodiments of the disclosure, as illustrated in FIG. 1 to FIG. 6, an area of a single one of the plurality of third sub-pixels 03 is for example smaller than an area of a single one of the plurality of first sub-pixels 01, and is for example also smaller than an area of a single one of the plurality of second sub-pixels 02; i.e., an area of a single one of the green sub-pixels is smaller than an area of a single one of the red sub-pixels, and is also smaller than an area of a single one of the blue sub-pixels. In other words, in an embodiment, since human eyes are relatively sensitive to green color, i.e., the color of the green sub-pixels, then, an area of a single one of the green sub-pixels may for example be set to be smallest.

In addition, for example, in above pixel arrangement structure according to embodiments of the disclosure, an area of a single one of the plurality of second sub-pixels 02 is for example equal to an area of a single one of the plurality of first sub-pixels 01, i.e., an area of a single one of the red sub-pixels is equal to an area of a single one of the blue sub-pixels. Or alternatively, an area of a single one of the plurality of second sub-pixels 02 is for example different from an area of a single one of the plurality of first sub-pixels 01, i.e., an area of a single one of the red sub-pixels is different from an area of a single one of the blue sub-pixels, without being limited herein. Generally, both light-emitting efficiency and service life of the blue sub-pixels are lower than light-emitting efficiency and service life of the red sub-pixels; therefore, by way of example, an area of a single one of the blue sub-pixels is set to be larger than an area of a single one of the red sub-pixels. Therefore, for example, as far as an area of a single one sub-pixel is concerned, for example, there exist following settings: in an embodiment, by way of example, an area of a single one of the blue sub-pixels is greater than an area of a single one of the red sub-pixels, and the area of a single one of the red sub-pixels is in turn greater than an area of a single one of the green sub-pixels; or in an alternative embodiment, by way of example, an area of a single one of the blue sub-pixels is greater than an area of a single one of the green sub-pixels, and the area of a single one of the green sub-pixels is in turn greater than an area of a single one of the red sub-pixels.

For example, in above pixel arrangement structure according to embodiments of the disclosure, as illustrated in FIG. 1 to FIG. 5, an area of each of the plurality of third sub-pixels 03 is for example the same. As such, it ensures that in any one light-emitting pixel point formed by several first sub-pixels 01, several second sub-pixels 02 and a respective third sub-pixel 03, the plurality of third sub-pixels 03 have the same light-emitting area as one another.

Figure 6:
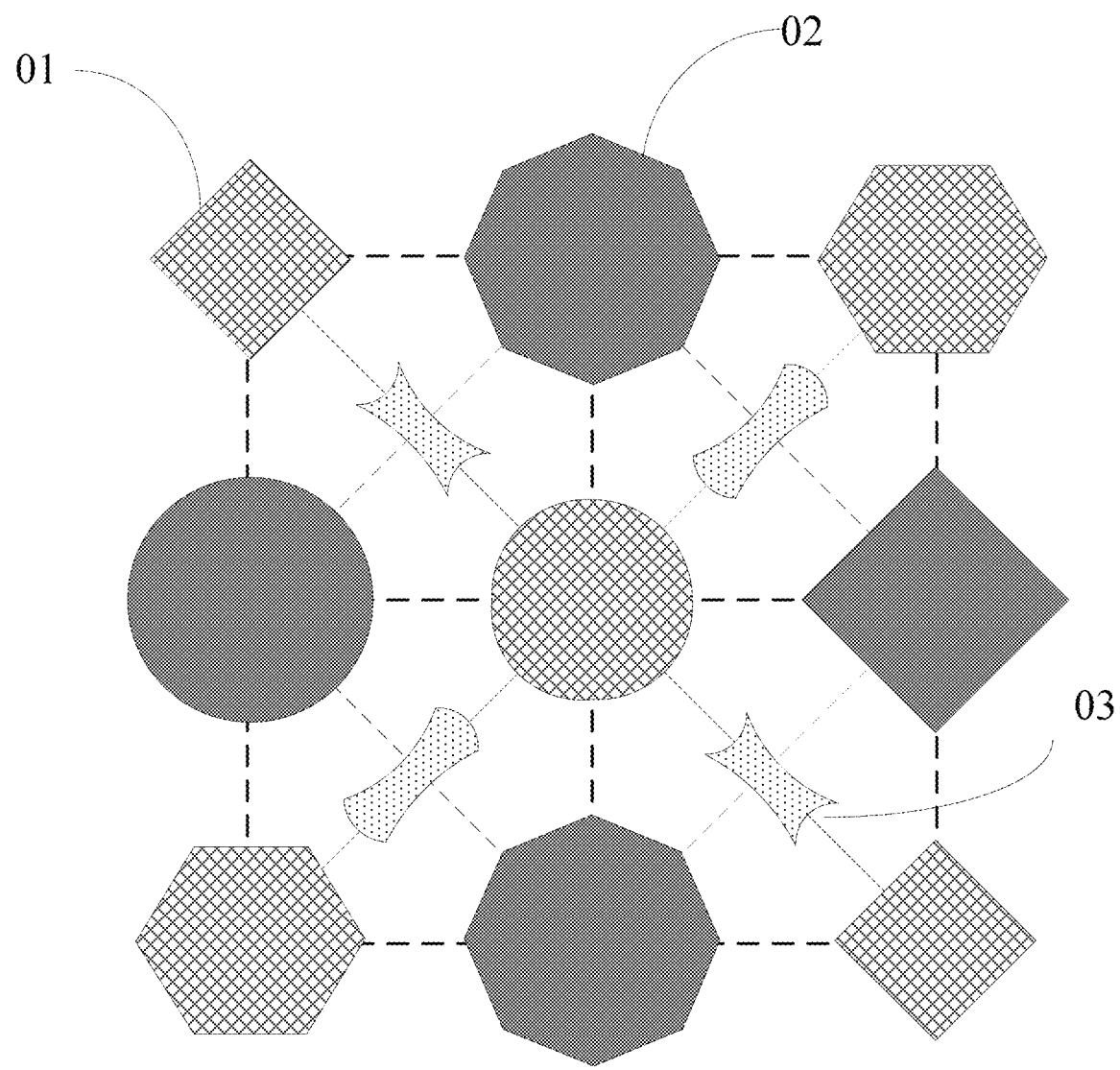
FIG. 6 illustrates a schematic view of still yet another pixel arrangement structure according to exemplary embodiments of the disclosure.

Of course, in specific implementation, in above pixel arrangement structure according to embodiments of the disclosure, as illustrated in FIG. 6, it also illustrates that at least two of the plurality of third sub-pixels 03 have different areas from one another, without being limited herein.

For example, in above pixel arrangement structure according to embodiments of the disclosure, as illustrated in FIG. 1 to FIG. 4, for example, the plurality of first sub-pixels 01 have the same shape as one another. As such, it ensures that in any one light-emitting pixel point formed by several first sub-pixels 01, several second sub-pixels 02 and a respective third sub-pixel 03, the plurality of first sub-pixels 01 have the same light-emitting area as one another.

Of course, in specific implementation, in above pixel arrangement structure according to embodiments of the disclosure, as illustrated in FIG. 5 and FIG. 6, it also illustrates that at least two of the plurality of first sub-pixels 01 have different areas from one another, without being limited herein.

For example, in above pixel arrangement structure according to embodiments of the disclosure, as illustrated in FIG. 1 to FIG. 4, for example, the plurality of second sub-pixels 02 have the same shape as one another. As such, it ensures that in any one light-emitting pixel point formed by several first sub-pixels 01, several second sub-pixels 02 and a respective third sub-pixel 03, the plurality of second sub-pixels 02 have the same light-emitting area as one another.

Of course, in specific implementation, in above pixel arrangement structure according to embodiments of the disclosure, as illustrated in FIG. 5 and FIG. 6, it also illustrates that at least two of the plurality of second sub-pixels 02 have different areas from one another, without being limited herein.

Moreover, in embodiments of the disclosure, as to areas of various sub-pixels, for example, in a single pixel arrangement structure, for example, an area of a single one of the plurality of first sub-pixels 01 functioning as red sub-pixels is for example referred to as $S_{01}$ hereinafter; an area of a single one of the plurality of third sub-pixels 03 functioning as green sub-pixels is for example referred to as $S_{03}$ hereinafter; and an area of a single one of the plurality of second sub-pixels 02 functioning as blue sub-pixels is for example referred to as $S_{02}$ hereinafter, respectively.

Correspondingly, for example, in embodiments of the disclosure, in a single pixel arrangement structure as above, in a comparison among a total area of the red sub-pixels, a total area of the green sub-pixels, and a total area of the blue sub-pixels, by way of example, since the number of the plurality of first sub-pixels 01 functioning as the red sub-pixels is five, the number of the plurality of third sub-pixels 03 functioning as the green sub-pixels is four, and the number of the plurality of second sub-pixels 02 functioning as the blue sub-pixels is four; then, correspondingly, in a single pixel arrangement structure, respective total areas of the three types of sub-pixels are correspondingly as follows: in a single pixel arrangement structure, a total area of the red sub-pixels is $S_{01}*5$, a total area of the green sub-pixels is $S_{03}*4$, and a total area of the blue sub-pixels is $S_{02}*4$.

Moreover, in a single first virtual rectangle, a ratio among respective total areas of the three types of sub-pixels is for example specifically as follows: for example, a ratio among a total area of the plurality of first sub-pixels 01 functioning as the red sub-pixels, a total area of the plurality of third sub-pixels 03 functioning as the green sub-pixels, and a total area of the plurality of second sub-pixels 02 functioning as the blue sub-pixels may be 1:(1.1~1.5):(1.2~1.7), and may further be 1:(1.2~1.35):(1.4~1.55), and may more specifically be 1:1.27:1.46.

Moreover, shapes and arrangement regularity/law of the sub-pixels are discussed schematically and exemplarily hereinafter.

In order to ensure that, during preparation, mask patterns may be consistent as for a same type of pixels so as to simplify patterning process, for example, in the pixel arrangement structure according to embodiments of the disclosure, as illustrated in FIG. 1 to FIG. 5, the plurality of third sub-pixels 03 have the same area as one another.

Or alternatively, in above pixel arrangement structure according to embodiments of the disclosure, for example, at least two of the plurality of third sub-pixels 03 have different shapes from one another, without being limited herein.

For example, in above pixel arrangement structure according to embodiments of the disclosure, as illustrated in FIG. 6, two of the plurality of third sub-pixels 03 located in a direction of one diagonal line of the first virtual rectangle have the same shape as each other, i.e., a first shape; and another two of the plurality of third sub-pixels 03 located in a direction of the other diagonal line of the first virtual rectangle also have the same shape as each other, i.e., a second shape. And the third sub-pixels 03 located respectively in directions of two different diagonal lines of the first virtual rectangle have different shapes from each other, i.e., the first shape is different from the second shape. Or alternatively, for example, four of the plurality of third sub-pixels 03 located within the first virtual rectangle have different respective shapes from one another, without being limited herein.

Moreover, for example, in above pixel arrangement structure according to embodiments of the disclosure, in a first virtual rectangle, four of the plurality of third sub-pixels 03 have the same pattern as one another or similar patterns to one another, then, their respective arrangement angles may for example be the same, or for example as illustrated in FIG. 1 to FIG. 7, four of the plurality of third sub-pixels which are located respectively within the four second virtual rectangles cooperating with one another to form the first virtual rectangle, are arranged in a 'X' shaped distribution, i.e., they are all in the form of a strip shape and point towards the center of the first virtual rectangle; or alternatively, in a first virtual rectangle, respective patterns of four of the plurality of third sub-pixels 03 may for example be in a bilateral symmetry about a vertical centerline, or in a longitudinal symmetry about a horizontal centerline. Or alternatively, respective patterns of four of the plurality of third sub-pixels 03 may for example be rotated at random angles, without being limited herein.

Specifically, in a condition that four of the plurality of third sub-pixels which are located respectively within the four second virtual rectangles and cooperate with one another to form the first virtual rectangle are arranged in the 'X' shaped distribution, then, in an embodiment, for example as illustrated in FIG. 1, FIG. 2, FIG. 3 and FIG. 5, side edges of the plurality of third sub-pixels are all concave, in two directions parallel to two diagonal lines of the first virtual rectangle respectively; specifically, two opposite side edges of each of the four of the plurality of third sub-pixels are concave in a direction parallel to one diagonal line of the first virtual rectangle, and other two opposite side edges of each of the four of the plurality of third sub-pixels are concave in another direction parallel to the other diagonal line of the first virtual rectangle, respectively. In another embodiment, for example as illustrated in FIG. 4 and FIG. 6, in at least two of the plurality of third sub-pixels 03 which extend in a direction parallel to one of two diagonal lines of the first virtual rectangle and point towards the central point of the first virtual rectangle, respective side edges facing towards the central point of the first virtual rectangle and respective side edges facing away from the central point of the first virtual rectangle are all concave.

In order to ensure that, during preparation, mask patterns may be consistent as for a same type of pixels so as to simplify patterning process, for example, in the pixel arrangement structure according to embodiments of the disclosure, as illustrated in FIG. 1 to FIG. 4, the plurality of first sub-pixels 01 have the same shape as one another.

Of course, in specific implementation, in above pixel arrangement structure according to embodiments of the disclosure, as illustrated in FIG. 5 and FIG. 6, it also illustrates that at least two of the plurality of first sub-pixels 01 have different shapes form one another, without being limited herein.

Moreover, for example, in above pixel arrangement structure according to embodiments of the disclosure, in a first virtual rectangle, five of the plurality of first sub-pixels 01 have the same pattern or similar patterns, then, their respective arrangement angles may for example be the same, or alternatively the five of the plurality of first sub-pixels 01 may for example be rotated at random angles, without being limited herein.

In order to ensure that, during preparation, mask patterns may be consistent as for a same type of pixels so as to simplify patterning process, for example, in the pixel arrangement structure according to embodiments of the disclosure, as illustrated in FIG. 1 to FIG. 4, the plurality of second sub-pixels 02 have the same shape as one another.

Of course, in specific implementation, in above pixel arrangement structure according to embodiments of the disclosure, as illustrated in FIG. 5 and FIG. 6, it also illustrates that at least two of the plurality of second sub-pixels 02 have different shapes from one another, without being limited herein.

Moreover, for example, in above pixel arrangement structure according to embodiments of the disclosure, in a first virtual rectangle, four of the plurality of second sub-pixels 02 have the same pattern or similar patterns, then, their respective arrangement angles may for example be the same, or alternatively the four of the plurality of second sub-pixels 02 may for example be rotated at random angles, without being limited herein.

By way of example, in above pixel arrangement structure according to embodiments of the disclosure, as illustrated in FIG. 1 to FIG. 3, the plurality of first sub-pixels 01 and the plurality of second sub-pixels 02 have the same shape as each other; or alternatively as illustrated in FIG. 4 to FIG. 6, the plurality of first sub-pixels 01 and the plurality of second sub-pixels 02 have the different shape from each other, without being limited herein.

In specific implementation, in above pixel arrangement structure according to embodiments of the disclosure, shapes of the plurality of first sub-pixels 01 and the plurality of second sub-pixels 02 may for example in the form of respective regular shapes, or for example in the form of respective irregular shapes, without being limited herein. Generally, regular patterns are more readily to manufacture; therefore, for example, in the pixel arrangement structure according to embodiments of the disclosure, as illustrated in FIG. 1 to FIG. 6, shapes of the plurality of first sub-pixels 01 and the plurality of second sub-pixels 02 are in the form of respective regular shapes, e.g., circular shape, elliptic shape, regular polygonal shapes (such as square shape, regular hexagonal shape, regular octagonal shape and the like), and other convex polygonal shapes, or curved polygonal shapes, and the like, without being limited herein.

It should be noticed that, patterns of pixels being inconsistent with one another in embodiments of the disclosure means that shapes of pixels are not consistent, e.g., one is in the form of circular shape, while another is in the form of rectangular shape. On the contrary, patterns of pixels being consistent with one another in embodiments of the disclosure means that shapes of pixels are the same as one another or similar to one another, e.g., two pixels are both shaped in the form of triangular shape, then their respective shapes should be considered to be consistent with each other whether their respective areas are the same or not.

Figure 8:
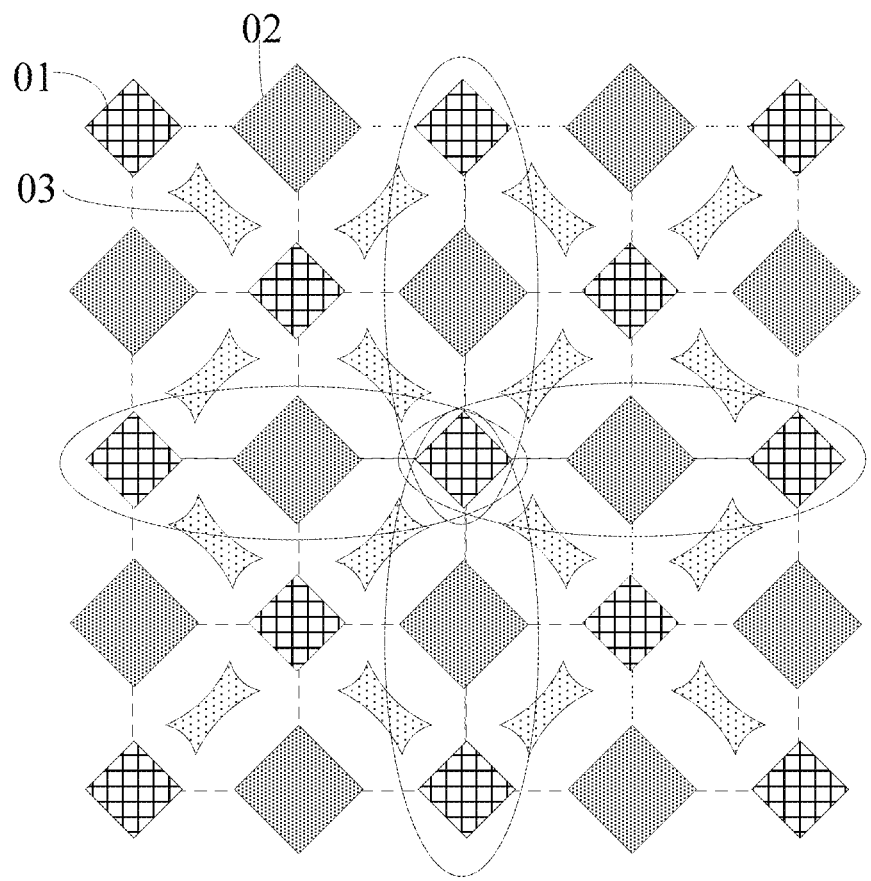
FIG. 8 illustrates a structural schematic view of an organic electroluminescent display panel according to exemplary embodiments of the disclosure.

Based on the same inventive concept, in another aspect of embodiments of the disclosure, there is further provided an organic electroluminescent display panel, as illustrated in FIG. 8, comprising a plurality of pixel arrangement structure arranged closely/tightly (as illustrated in FIG. 8, four pixel arrangement structures are taken as an example), each of which is above pixel arrangement structure according to embodiments of the disclosure, and first virtual rectangles adjacent to each other in a row direction are arranged to share common sub-pixels located on respective side edges facing towards each other, and first virtual rectangles adjacent to each other in a column direction are arranged to share common sub-pixels located on respective side edges facing towards each other. In other words, two pixel arrangement structures adjacent to each other share first sub-pixels 01 and a second sub-pixel 02 both being located at respective side edges (e.g., at corner points or at a center point thereof) abutting against each other of two respective first virtual rectangles adjacent to each other, e.g., as shown in FIG. 8, three pixels circled in each ellipse are pixels shared by two pixel arrangement structures adjacent to each other. More specifically, for example as illustrated in FIG. 8, a sub-pixel located at a lower right corner of each first virtual rectangle also functions as the sub-pixel located at a lower left corner of a following first virtual rectangle in the same row as said each first virtual rectangle, and a sub-pixel located at an upper right corner of each first virtual rectangle also functions as the sub-pixel located at an upper left corner of a following first virtual rectangle in the same row as said each first virtual rectangle; and a sub-pixel located at a lower left corner of each first virtual rectangle also functions as the sub-pixel located at an upper left corner of a following first virtual rectangle in the same column as said each first virtual rectangle, and a sub-pixel located at a lower right corner of each first virtual rectangle also functions as the sub-pixel located at an upper right corner of a following first virtual rectangle in the same column as said each first virtual rectangle. Since the organic electroluminescent display panel operates to solve problem depending on a similar principle to that of above pixel arrangement structure, then, embodiments of the organic electroluminescent display panel may for example refer to implementation of above pixel arrangement structure, without repeating herein any more.

Moreover, it should be pointed out that, in embodiments of the disclosure, in the organic electroluminescent display panel, since first virtual rectangles adjacent to each other in a row direction are arranged to share common sub-pixels located on respective side edges facing towards each other, and first virtual rectangles adjacent to each other in a column direction are arranged to share common sub-pixels located on respective side edges facing towards each other, in other words, as to each of the first virtual rectangles in the organic electroluminescent display panel, in a condition that said each first virtual rectangle abuts at an side edge and corner points thereof against another first virtual rectangle which is adjacent thereto, then sub-pixel thereof at said positions (i.e., the side edge and corner points at which these first virtual rectangles abut against each other) are shared by said another first virtual rectangle which is adjacent thereto, such that the ratio among respective total areas of three types of sub-pixels in each single first virtual rectangle in various first virtual rectangles, may not be equal to a ratio among respective total areas of three types of sub-pixels across the whole organic electroluminescent display panel.

Moreover, according to regularity of sub-pixels at positions of the side edge and corner points where adjacent first virtual rectangles abut against each other are shared by said adjacent first virtual rectangles, then, it can be known that, since the third sub-pixels 03 functioning as the green sub-pixels (G) are always located inside respective first virtual rectangles, respectively, the third sub-pixels 03 are not shared by any two of the first virtual rectangles adjacent to each other. Therefore, as to the whole organic electroluminescent display panel, in a ratio among respective total numbers of the three types of sub-pixels, a percentage of the green sub-pixels may be increased as compared with a percentage of the green sub-pixels as in a ratio among respective total numbers of the three types of sub-pixels in a single first virtual rectangle.

Specifically, for example, across the whole organic electroluminescent display panel, a ratio among a total number of the plurality of first sub-pixels functioning as the red sub-pixels (R), a total number of the plurality of third sub-pixels functioning as the green sub-pixels (G), and a total number of the plurality of second sub-pixels functioning as the blue sub-pixels (B) is 1:2:1. It is apparent that such a ratio is different from a ratio among respective total numbers of the three types of sub-pixels in a single first virtual rectangle.

Specifically, in the organic electroluminescent display panel according to embodiments of the disclosure, as illustrated in FIG. 8, first sub-pixels 01 and second sub-pixels 02 are arranged alternately in the row direction and are also arranged alternately in the column direction, and the third sub-pixels 03 are located within second virtual rectangles each of which is circled and delimited by two of the first sub-pixels 01 and two of the second sub-pixels 02. As such, during display, any two of the first sub-pixels 01 and any two of the second sub-pixels 02, all of which are adjacent to one another, cooperate with an adjacent third sub-pixel 03 to form collectively a light-emitting pixel point, and a display effect of high resolution may be implemented among pixels by color sharing principle on the basis of a relatively low physical resolution.

Based on the same inventive concept, in still another aspect of embodiments of the disclosure, there is further provided a metal mask which may implement a high resolution, and is configured to manufacture above pixel arrangement structure according to embodiments of the disclosure, comprising: a plurality of opening areas being distributed uniformly and having the same shape as at least one type of the plurality of first sub-pixels, the plurality of second sub-pixels, and the plurality of third sub-pixels, and an orthogonal projection of the plurality of opening areas on the pixel arrangement structure corresponds to or coincides with positions of at least one type of the plurality of first sub-pixels, the plurality of second sub-pixels and the plurality of third sub-pixels in the pixel arrangement structure, i.e., an orthogonal projection of the plurality of opening areas on a plane where the pixel arrangement structure is located at least partially overlaps with at least one type of the plurality of first sub-pixels, the plurality of second sub-pixels and the plurality of third sub-pixels in the pixel arrangement structure.

Based on the same inventive concept, in yet another aspect of embodiments of the disclosure, there is further provided a display device, comprising the organic electroluminescent display panel according any one of above embodiments of the disclosure. This display device is for example any product or component having display functionality, such as mobile phone, tablet computer, television, monitor, laptop computer, digital photo frame, navigator and the like. Embodiments of the display device may for example refer to embodiments of above display device, without repeating herein any more.

A pixel arrangement structure, organic electroluminescent display panel, a fine metal mask, a display device according to embodiments of the disclosure are provided as above, the pixel arrangement structure comprising: a plurality of sub-pixels arranged such that they are not overlapped with but are spaced apart from one another, the plurality of sub-pixels comprising a plurality of first sub-pixels, a plurality of second sub-pixels and a plurality of third sub-pixels; one of the plurality of first sub-pixels and other four of the plurality of first sub-pixels are arranged to function as a central point and four vertices respectively to define a first virtual rectangle, i.e., by positioning the plurality of first sub-pixels at the central point and vertices of four corners of the first virtual rectangle respectively; the plurality of second sub-pixels are located respectively at positions of central points of side edges of the first virtual rectangle, and the plurality of third sub-pixels are shaped respectively to be a concave polygon or a pattern formed by curved line segments and are located within second virtual rectangles respectively, each of the second virtual rectangles is formed by two of the second sub-pixels at positions of central points of two adjacent side edges of the first virtual rectangle, and one of the plurality of first sub-pixels at a position of the central point of the first virtual rectangle and another one of the plurality of first sub-pixels at a position of a corner of the first virtual rectangle which are connected sequentially to function as vertices of the corners of the respective second virtual rectangle; and four of the second virtual rectangles forming collectively the first virtual rectangle. To sum up, the technical solution of embodiments of the disclosure may have beneficial effects as below: as compared with a pixel arrangement structure in relevant art, in an equivalent process condition, the plurality of first sub-pixels, the plurality of second sub-pixels and the plurality of third sub-pixels are arranged closely/tightly, so as to minimize spacings among adjacent pixels and among adjacent sub-pixels as much as possible; therefore, in a condition of the same resolution, the opening area of each pixel is increased, such that a drive current of the display device is decreased and a service life of the display components is in turn increased.

Although various embodiments of the present disclosure have been described above with reference to the drawings, those skilled in the art will understand that different embodiments may be combined or partially substituted without causing a conflict. Various modifications and variation may be made to the embodiments of the present disclosure without departing from the scope of the invention. All such modifications and variations are intended to fall within the scope of the present disclosure. Therefore, the protection scope of the present disclosure should be determined by those defined by the claims.

What is claimed is:

1. A pixel arrangement structure, comprising:
a plurality of sub-pixels arranged such that they are not overlapped with but are spaced apart from one another, comprising: a plurality of first sub-pixels, a plurality of second sub-pixels and a plurality of third sub-pixels,
wherein a shape of the first sub-pixels, a shape of the second sub-pixels, and a shape of the third sub-pixels are the same, and each of the shape of the first sub-pixels, the shape of the second sub-pixels, and the shape of the third sub-pixels is a circle or quasi-circle,
wherein an area of the first sub-pixels, an area of the second sub-pixels, and an area of the third sub-pixels are different, and
wherein the plurality of first sub-pixels and the plurality of second sub-pixels are arranged into a plurality of rows and a plurality of columns, and the plurality of first sub-pixels and the plurality of second sub-pixels are alternately arranged in a row direction and in a column direction, so that two first sub-pixels and two second sub-pixels in adjacent rows and adjacent columns form a virtual quadrilateral, and a respective third sub-pixel is located within the virtual quadrilateral.

2. The pixel arrangement structure according to claim 1, wherein the area of the second sub-pixels is greater than the area of the first sub-pixels, and the area of the first sub-pixels is greater than the area of the third sub-pixels.

3. The pixel arrangement structure according to claim 1, wherein areas of at least two first sub-pixels among the plurality of first sub-pixels are different; or
areas of the plurality of first sub-pixels are equal.

4. The pixel arrangement structure according to claim 1, wherein areas of at least two second sub-pixels among the plurality of second sub-pixels are different; or
areas of the plurality of second sub pixels are equal.

5. The pixel arrangement structure according to claim 1, wherein a line connecting a geometric center of the respective third sub-pixel and a geometric center of a respective second sub-pixel adjacent to the respective third sub-pixel intersects with a line connecting the geometric center of the respective third sub-pixel and a geometric center of a respective first sub-pixel adjacent to the respective third sub-pixel.

6. The pixel arrangement structure according to claim 5, wherein the line connecting the geometric center of the respective third sub-pixel and the geometric center of the respective second sub-pixel adjacent to the respective third sub-pixel is perpendicular to the line connecting the geometric center of the respective third sub-pixel and the geometric center of the respective first sub-pixel adjacent to the respective third sub-pixel.

7. The pixel arrangement structure according to claim 1, wherein a distance between a geometric center of the respective third sub-pixel and a geometric center of a respective second sub-pixel adjacent to the respective third sub-pixel is substantially equal to a distance between the geometric center of the respective third sub-pixel and a geometric center of a respective first sub-pixel adjacent to the respective third sub-pixel.

8. The pixel arrangement structure according to claim 1, wherein a minimum distance between an edge of the respective third sub-pixel and an edge of a respective first sub-pixel adjacent to the respective third sub-pixel is greater than a minimum distance between the edge of the respective third sub-pixel and an edge of a respective second sub-pixel adjacent to the respective third sub-pixel.

9. The pixel arrangement structure according to claim 1, wherein a plurality of virtual quadrilaterals are periodically arranged in the row direction and/or in the column direction, adjacent virtual quadrilaterals have a common side, and a respective first sub-pixel and a respective second sub-pixel on the common side are shared by the adjacent virtual quadrilaterals.

10. The pixel arrangement structure according to claim 1, wherein one of the first sub-pixels or the second sub-pixels are red sub-pixels, and the other of the first sub-pixels or the second sub-pixels are blue sub-pixels; and the third sub-pixels are green sub-pixels.

11. The pixel arrangement structure according to claim 10, wherein the first sub-pixels are the red sub-pixels, and the second sub-pixels are the blue sub-pixels.

12. The pixel arrangement structure according to claim 1, wherein the plurality of first sub-pixels are arranged to define a first virtual rectangle, by locating one of the plurality of first sub-pixels at a position functioning as a position of a central point of the first virtual rectangle and locating four other first sub-pixels of the plurality of first sub-pixels at respective positions functioning as positions of four vertices of the first virtual rectangle respectively, and the first virtual rectangle comprises four second virtual rectangles which are arranged in a 2×2 matrix in mirror symmetry and abut against one another one by one, and each two second virtual rectangles abutting against each other share two common vertices located at an interface where said each two second virtual rectangles abut against each other and a common side edge defined between the two common vertices, and wherein the virtual quadrilateral is the second virtual rectangle.

13. The pixel arrangement structure according to claim 12, wherein the plurality of second sub-pixels are located respectively at positions of central points of side edges of the first virtual rectangle, and two of the plurality of second sub-pixels located at respective central positions of two adjacent side edges of the first virtual rectangle, and one of the plurality of first sub-pixels located adjacent to the two second sub-pixels at a position of a vertex of the first virtual rectangle where the two adjacent side edges intersect with each other, and another one of the plurality of first sub-pixels located adjacent to the two second sub-pixels at a position of the central point of the first virtual rectangle, are located respectively to define cooperatively respective positions of four vertices of each of the four second virtual rectangles.

14. The pixel arrangement structure according to claim 13, wherein a ratio of a total area of five first sub-pixels defining the first virtual rectangle, a total area of four third sub-pixels located within the first virtual rectangle, and a total area of four second sub-pixels located on four sides of the first virtual rectangle is 1:(1.1 to 1.5):(1.2 to 1.7).

15. The pixel arrangement structure according to claim 14, wherein the ratio of the total area of the five first sub-pixels defining the first virtual rectangle, the total area of the four third sub-pixels located within the first virtual rectangle, and the total area of the four second sub-pixels located on the four sides of the first virtual rectangle is 1:(1.2 to 1.35):(1.4 to 1.55).

16. The pixel arrangement structure according to claim 15, wherein the ratio of the total area of the five first sub-pixels defining the first virtual rectangle, the total area of the four third sub-pixels located within the first virtual rectangle, and the total area of the four second sub-pixels located on the four sides of the first virtual rectangle is 1:1.27:1.46.

17. A display device, comprising the pixel arrangement structure according to claim 1.

* * * * *